(12) United States Patent
Clara et al.

(10) Patent No.: US 6,646,580 B2
(45) Date of Patent: Nov. 11, 2003

(54) DIGITAL/ANALOG CONVERTER WITH PROGRAMMABLE GAIN

(75) Inventors: Martin Clara, Villach (AT); Hubert Weinberger, Soboth (AT); Christian Fleischhacker, Pischeldorf (AT); Andreas Wiesbauer, Pörtschach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/012,009

(22) Filed: Oct. 29, 2001

(65) Prior Publication Data

US 2002/0109618 A1 Aug. 15, 2002

(30) Foreign Application Priority Data

Oct. 31, 2000 (DE) .......................................... 100 53 914

(51) Int. Cl.[7] .............................................. H03M 1/00
(52) U.S. Cl. ..................................... 341/136; 341/144
(58) Field of Search ............................... 341/136, 153, 341/135, 118, 144; 323/315

(56) References Cited

U.S. PATENT DOCUMENTS

| | | | | |
|---|---|---|---|---|
| 4,967,140 A | * | 10/1990 | Groeneveld et al. | ........ 323/315 |
| 5,798,723 A | * | 8/1998 | Fong | .......................... 323/315 |
| 5,815,103 A | * | 9/1998 | Comminges et al. | ....... 341/136 |
| 6,346,901 B1 | * | 2/2002 | Aiura et al. | ................. 341/135 |
| 6,362,764 B1 | * | 3/2002 | Niimi et al. | ................. 341/118 |
| 6,424,824 B1 | * | 7/2002 | Stepp et al. | ............. 455/197.3 |

* cited by examiner

Primary Examiner—Jean Bruner Jeanglaude
(74) Attorney, Agent, or Firm—Jenkins, Wilson & Taylor, P.A.

(57) ABSTRACT

Digital/analog converter with programmable gain for converting a digital input signal ($D_n$) into an analog output signal, the digital/analog converter (1) having:

a signal input (2) for applying the digital input signal ($D_n$)

a reference current source (7) for generating a reference current ($I_{ref\phi}$), the current intensity of the reference current output by the reference current source (7) being adjustable via a setting terminal (4) of the digital/analog converter (1)

current mirror circuits which mirror the generated reference current ($I_{ref}$) with an associated current mirror ratio to form mirror currents a controllable switching device (57), which switches through the mirror currents output by the current mirror circuits, in a manner dependent on the digital input signal ($D_n$) present at the signal input (2), to a summation current node (62) for generating a summation current ($I_{sum}$) and a current/voltage converter (17) for converting the generated summation current ($I_{sum}$) into a corresponding voltage ($U_A$), which is output as an analog output signal via an analog signal output (3) of the digital/analog converter (1).

6 Claims, 2 Drawing Sheets

DIGITAL/ANALOG CONVERTER WITH PROGRAMMABLE GAIN

TECHNICAL FIELD

The invention relates to a digital/analog converter with programmable gain for converting a digital input signal into an analog output signal.

RELATED ART

FIG. 1 shows a conventional current-controlled digital/analog converter DAC 1 according to the prior art. The digital/analog converter 1 shown in FIG. 1 contains a reference current source 2 which outputs a reference current to a current mirror array S 3. The current mirror array S 3 contains current mirror circuits which mirror the generated reference current with an associated mirror ratio to form mirror currents and output them via an associated controllable switch to a summation current node. In this case, the controllable switches are driven by n lines connected to a digital signal input E 4 of the digital/analog converter DAC 1. The controllable switches are driven by n lines connected to a digital signal input E 4 of the digital/analog converter DAC 1. The controllable switches in the current mirror circuit S 3 are driven in accordance with the digital data value $D_n$ that is present and is to be converted, with the result that the summation current output by the mirror circuit S 3 corresponds to the product of the data value $D_n$ present and the reference current $I_{ref}$ output by the reference current source 2. In a current/voltage converter 5 connected downstream, the summation current output by the mirror circuit S 3 is converted into a corresponding voltage and output to a voltage amplifier V 6 connected downstream for setting the output level of the analog output signal. The amplifier V 6 amplifies the voltage $U_A$ output by the current/voltage converter 5 and outputs an output voltage K·$U_A$ amplified by a gain factor K to a signal output A 7 of the digital/analog converter DAC 1. At the amplifier V 6, the desired gain factor K can be set via setting lines.

The conventional digital/analog converter DAC 1 illustrated in FIG. 1 has the disadvantage, however, that the programmable amplifier V 6 contained therein has a high current consumption and has a relatively high area requirement when the digital/analog converter 1 is integrated on a chip. Furthermore, the programmable amplifier V 6 causes additional signal distortions of the analog output signal.

SUMMARY OF THE INVENTION

The object of the present invention, therefore, is to provide a digital/analog converter which does not require an additional amplifier V for level setting of the analog output signal.

This object is achieved according to the invention by means of a digital/analog converter having the features specified in patent claim 1.

The invention provides a digital/analog converter with programmable gain for converting a digital input signal into an analog output signal, the digital/analog converter having a digital signal input for applying the digital input signal, a reference current source for generating a reference current, the current intensity of the reference current output by the reference current source being adjustable via setting lines, current mirror circuits which mirror the generated adjustable reference current in each case with an associated mirror ratio to form mirror currents, a controllable switching device, which switches through the mirror currents output by the current mirror circuits, in a manner dependent on the digital input signal present at the signal input, to a summation current node for generating a summation current and a current/voltage converter for converting the generated summation current into a corresponding voltage, which is output as an analog output signal via an analog signal output of the digital/analog converter.

The reference current source preferably has a switchable resistor network.

The resistor network preferably contains a plurality of resistors which can be switched via associated switches for altering the reference current flowing through the resistor network.

In this case, the switches of the resistor network can preferably be driven via setting lines.

The current/voltage converter is preferably a resistor.

The current mirror circuits preferably each comprise two current mirror transistors whose control terminals are connected to one another.

In this case, the current mirror transistors are preferably MOSFET transistors.

In an alternative embodiment of the digital/analog converter according to the invention, the current mirror transistors are bipolar transistors.

BRIEF DESCRIPTION OF THE DRAWINGS

A preferred embodiment of the digital/analog converter according to the invention is described below with reference to the accompanying figures in order to elucidate features that are essential to the invention.

In the figures.

DETAILED DESCRIPTION OF THE INVENTION

Figure 2:
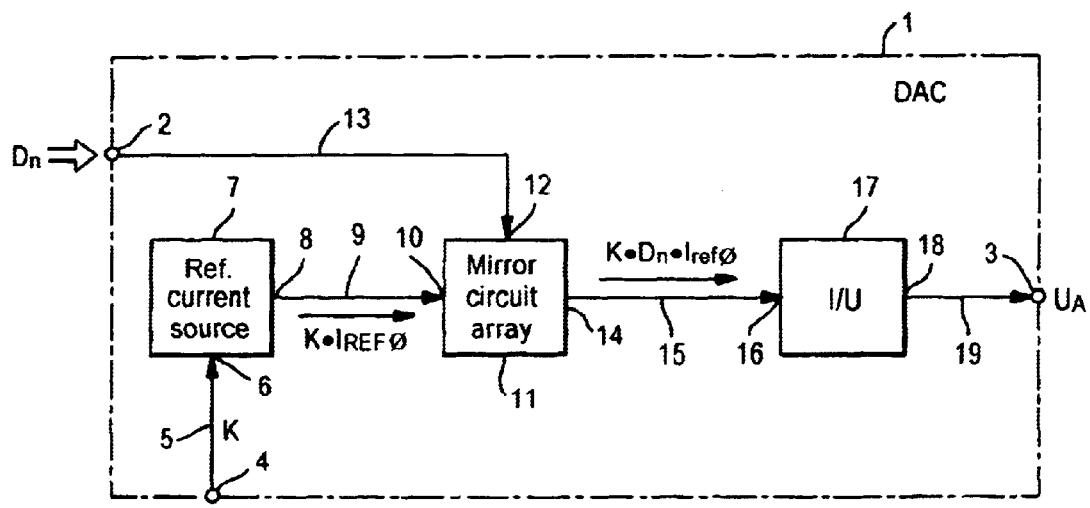
FIG. 2 shows a block diagram of a digital/analog converter according to the invention.

As can be seen from FIG. 2, the digital/analog converter 1 according to the invention has a digital signal input 2 for applying a digital data signal $D_n$ having a width of n bits. The digital/analog converter 1 furthermore has an analog signal output 3 for outputting an analog output signal. The gain of the programmable digital/analog converter 1 according to the invention is set via a setting terminal 4. The setting terminal 4 is connected via a setting line 5 to an input 6 of a programmable reference current source 7 of the digital/analog converter 1. The reference current source 7 has an output a, via which the reference current source 7 outputs a reference current $KI_{REF}$, amplified in accordance with the gain factor K present, via a reference current line 9 to a reference current input 10 of a current mirror circuit array 11. The current mirror circuit array 11 contains a plurality of current mirror circuits which mirror the received amplified reference current in each case with an associated current mirror ratio to form mirror currents. Furthermore, the current mirror circuit array 11 contains controllable switching devices which switch through the mirror currents output by the current mirror circuits, in a manner dependent on a digital data value $D_n$, co a summation current node for generating a summation current. The digital data value $D_n$ is present at a digital data input 12 of the current mirror circuit array 11. The digital data input 12 of the current mirror circuit array 11 is connected via n data lines 13 to the digital data input 2 of the digital/analog converter 1 according to the invention. The mirrored mirror currents combined at the summation current node are output via a current output 14 and a current line 15 to an input 16 of a current/voltage converter 17. The current/voltage converter 17 converts the summation current present into a corresponding output voltage $U_A$ and outputs the generated output voltage via an output 18 and a line 19 to the analog signal output 3 of the digital/analog converter 1. The current/voltage conversion circuit 17 preferably comprises a resistor having the nonreactive resistance R.

The analog output voltage $U_A$ output at the analog signal output 3 of the digital/analog converter 1 according to the invention has the following value:

$$U_A = (k \cdot R \cdot I_{ref\phi}) \cdot D_n \quad (1)$$

where k is the gain factor of the programmable reference current source 7,

R is the nonreactive resistance of the current/voltage converter 17, $I_{ref\phi}$ is a reference current generated by the reference current source 7, and $D_n$ is the digital value to be converted.

Figure 1:
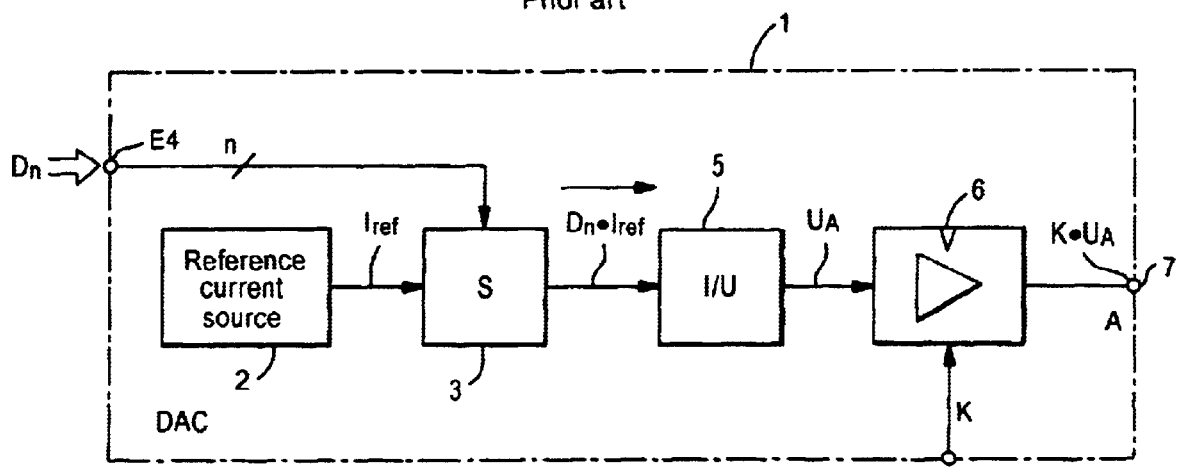
FIG. 1 shows a digital/analog converter according to the prior art.

As can be seen by comparing FIGS. 1 and 2, in contrast to the conventional digital/analog converter DAC, the digital/analog converter 1 according to the invention does not contain an amplifier V. In the digital/analog converter 1 according to the invention, the signal level of the analog output signal which is output via the analog signal output 3 of the digital/analog converter 2 according to the invention is set by setting the reference current output by the reference current source 7. The invention's circuitry construction of the digital/analog converter 1 obviates the amplifier by comparison with the conventional digital/analog converter DAC. Consequently, the current demand of the digital/analog converter 1 according to the invention decreases. The necessary area requirement in the case of integration of the digital/analog converter 1 according to the invention is likewise reduced by comparison with the conventional digital/analog converter DAC, as is illustrated in FIG. 1. In the digital/analog converter 1 according to the invention, a programmable reference current source 7 is used instead of the programmable amplifier V connected downstream.

Figure 3:
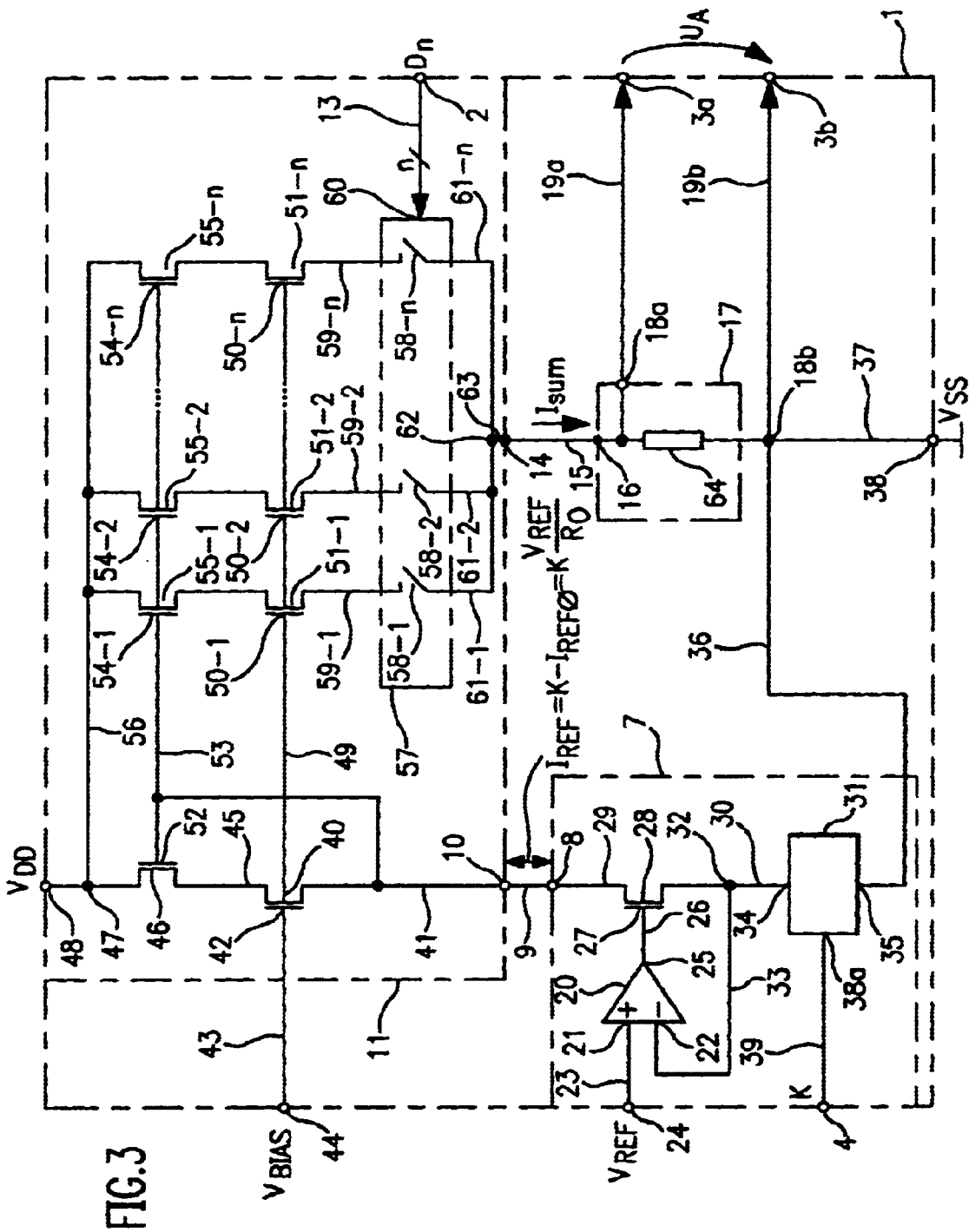
FIG. 3 shows a preferred embodiment of the digital/analog converter according to the invention.

FIG. 3 shows a particularly preferred embodiment of the digital/analog converter 1 according to the invention.

As can be seen from FIG. 3, the programmable reference current source 7 contains an operational amplifier 20 having a non-inverting input 21 and an inverting input 22. The non-inverting input 21 of the operational amplifier 20 is connected via a line 23 to a reference voltage terminal 24 of the digital/analog converter 1 according to the invention for applying a reference voltage $V_{ref}$. The operational amplifier 20 has a signal output 25 which is connected via a line 26 to a gate 27 of an NMOS transistor 28. The NMOS transistor 28 is connected via a line 29 to the reference current output 9 of the reference current source 7. Furthermore, the NMOS transistor 28 is connected via a line 30 to a controllable resistor network 31. At a branching node 32, the line 30 is fed back via a line 33 to the inverting signal input 22 of the operational amplifier 20. The resistor network 31 is connected to the line 30 via a terminal 34, and the resistor network 31 is connected to a negative supply voltage, or to ground $V_{SS}$, via a further terminal 35. For this purpose, the terminal 35 of the resistor network 31 is connected via a line 36 and a line 37 to a grounding terminal 38 of the digital/analog converter 1 according to the invention.

The resistor network 31 contained in the reference current source 7 has a control input 38a, which is connected via lines 39 to the setting terminal 4 of the digital/analog converter 1. The resistor network 31 contains a plurality of resistors which can be switched via associated switches, in a manner dependent on the gain factor K present at the control input 38, for altering the reference current ($I_{ref} = Ki_{ref\phi}$) flowing through the resistor network 31. The programmed reference current is output from the reference current source 7 via the current output 8 and the current line 9 to the current input 10 of the current mirror circuit array 11.

In the embodiment illustrated in FIG. 3 the current mirror circuit array 11 has a PMOS transistor 40, which is connected to the current input 10 via a line 41. The transistor 40 furthermore has a gate terminal 42, which is connected via a line 43 via a setting terminal 44 for applying a BIAS voltage $V_{bias}$. A further PMOS transistor 46 is connected in series with the PMOS transistor 40 via a line 45 and is connected via a line 47 to a supply voltage terminal 48 of the digital/analog converter 1 for applying a supply voltage $V_{DD}$. The gate terminal 42 of the PMOS transistor 40 is connected via a line 49 to the gate terminals 50-1 to 50-n of PMOS transistors 51-1 to 51-n.

The gate terminal 52 of the PMOS transistor 46 is connected via a line 53 to gate terminals 54-1 to 54-n of PMOS transistors 55-1 to 55-n. The PMOS transistors 55 are supplied with the supply voltage $V_{DD}$ via a common supply line 56.

The current mirror circuit array 11 contains a controllable switching device 57 having n controllable switches 58-1 to 58-n. The controllable switches 58-1 to 56-n are connected in series with the PMOS transistors 50-1 to 50-n via lines 59-1 to 59-n. The controllable switches 58-1 to 58-n are driven via control lines connected to a control terminal 60 of the switching device 57. The digital control terminal 60 of the controllable switching device 57 is connected via a n control lines 13 to the digital data input 2 of the digital/analog converter 1. The controllable switches 58 are connected via lines 61-1 to 61-n to a common summation current node 62. The summation current node 62 is connected via a line 63 to the current output 14 of the current mirror circuit array 11.

In the preferred embodiment shown in FIG. 3, the current/voltage converter 17 comprises a resistor 64, which converts the summation current $I_{sum}$ flowing through it into a corresponding voltage UA, which is output via the analog signal output 3a, 3b of the digital/analog converter 1.

The amplified reference current $KI_{ref\phi}$ output by the reference current source 7 is multiply mirrored by the PMOS transistors of the current mirror circuit array 11 to form different mirror currents. The mirror currents present on the lines 59-1 to 59-n are switched through to the summation current node 62 by the controllable stitching device 57 in accordance with the digital data value $D_n$ present.

The current intensity of the output summation current $I_{sum}$ has the following value:

$$I_{sum} = k \cdot I_{ref\phi} \cdot D_n \quad (2)$$

The digital/analog converter 1 according to the invention can be used for example in a transmission signal path of an xDSL modem. In this case, the digital/analog converter 1 according to the invention converts a digital data signal $D_n$ present into an analog output voltage $U_A$ having an adjustable signal level. The analog output signal $U_A$ is filtered in a filter connected downstream and fed to a line driver connected to a two-wire telephone line.

LIST OF REFERENCE SYMBOLS

1 Digital/analog converter
2 Digital data input
3 Analog signal output
4 Setting terminal
5 Lines
6 Input
7 Programmable reference current source
8 Output
9 Line
10 Input
11 Current mirror circuit array
12 Input
13 Line
14 Output
15 Line
16 Input
17 Current/voltage converter
18 Output
19 Line
20 Operational amplifier
21 Non-inverting input
22 Inverting input
23 Line
24 Reference voltage terminal
25 Output
26 Line
27 Gate terminal
28 NMOS transistor
29 Line
30 Line
31 Resistor network
32 Node
33 Line
34 Input
35 Output
36 Line
37 Line
38 Terminal
39 Line
40 NMOS transistor
41 Line
42 Gate terminal
43 Line
44 Terminal
45 Line
46 NMOS transistor
47 Line
48 Supply voltage terminal
49 Line
50 Gate terminals
51 NMOS terminal
52 Gate terminal
53 Line
54 Gate terminal
55 NMOS transistors
56 Supply voltage line
57 Controllable switching device
58 Controllable switch
59 Lines
60 Control input
61 Lines
62 Summation current node
63 Line
64 Resistor

What is claimed is:

1. A digital/analog converter with programmable gain for converting a digital input signal ($D_n$) into an analog output signal, the digital/analog converter having:

(a) a signal input for applying the digital input signal ($D_n$);

(b) a reference current source for generating a reference current ($I_{ref}$), the current intensity of the reference current output by the reference current source being adjustable via a setting terminal of the digital/analog converter;

(c) a mirror circuit array which contains a plurality of current mirror circuits which mirror the generated reference current ($I_{ref}$) with an associated current mirror ratio to form mirror currents and a controllable switching device, which switches through the mirror currents output by the current mirror circuits, in a manner dependent on the digital input signal ($D_n$) present at the signal input, to a summation current node for generating a summation current ($I_{sum}$); and (d) a current/voltage converter for converting the generated summation current ($I_{sum}$) into a corresponding voltage ($U_A$), which is output as an analog output signal via an analog signal output of the digital/analog converter, wherein the reference current source comprises an operational amplifier having a non-inverting input, an inverting input and a signal output, a transistor having a gate connected to the output of the operational amplifier, and a controllable resistor network, which contains a plurality of resistors which can be switched via associated switches for altering the reference current ($I_{ref}$), flowing through the resistor network, and wherein the switches of the resistor network are connected via setting line to the setting terminal of the digital/analog converter.

2. The digital/analog converter as claimed in claim 1, wherein the current/voltage converter is a resistor.

3. The digital/analog converter as claimed in claim 1, wherein the current mirror circuits each comprise two current mirror transistors whose control terminals are connected to one another.

4. The digital/analog converter as claimed in claim 3, wherein the current mirror transistors are MOSFET transistors.

5. The digital/analog converter as claimed in claim 3, wherein the current mirror transistors are bipolar transistors.

6. The digital/analog converter as claimed in claim 1, wherein the non-inverting input of the operational amplifier is connected via a line to a reference voltage terminal of the digital/analog converter for applying a reference voltage ($V_{ref}$), the signal output of the operational amplifier is connected via a line to a gate of the NMOS transistor, the NMOS transistor is connected via a line to the reference current output of the reference current source and via a line to the controllable resistor network, in which case the line, at a branching node, is fed back via a line to the inverting signal input of the operational amplifier, and the resistor network is connected to the line via a terminal and is connected to a reference-ground potential ($V_{ss}$) via a further terminal, in which case the terminal of the resistor network is connected via a line and a line to a grounding terminal of the digital/analog converter.

* * * * *